United States Patent [19]

Shimizu et al.

[11] Patent Number: 4,706,217

[45] Date of Patent: Nov. 10, 1987

[54] SEQUENTIAL LOGIC CIRCUIT

[75] Inventors: Hiroshi Shimizu, Kawasaki; Masao Kaizuka, Yokohama, both of Japan

[73] Assignee: Kabushiki Kaisha Toshiba, Kawasaki, Japan

[21] Appl. No.: 843,748

[22] Filed: Mar. 25, 1986

[30] Foreign Application Priority Data

Mar. 28, 1985 [JP] Japan .................................. 60-64900

[51] Int. Cl.[4] ............................................. G11C 11/40
[52] U.S. Cl. ..................................... 365/154; 365/73; 365/78; 365/189; 365/190; 365/205
[58] Field of Search ...................... 365/73, 78, 75, 76, 365/154, 189, 190, 205, 230

[56] References Cited

U.S. PATENT DOCUMENTS 4,635,229 1/1987 Okumura et al. .................... 365/154

Primary Examiner—Terrell W. Fears
Attorney, Agent, or Firm—Schwartz, Jeffery, Schwaab, Mack, Blumenthal & Evans

[57] ABSTRACT

A circuit has a logic memory, a preceding logic circuit, a succeeding logic circuit, and a function defining circuit. An input signal is taken by the preceding logic circuit, where a new logic state is produced based on the input signal and a present logic state in the logic memory executing a defined calculation. The content of the logic memory is taken over by the new logic state. The succeeding logic circuit produces an output signal based on the logic state of the logic memory executing a defined calculation. The calculation executed in the succeeding or preceding logic circuit is defined by the defining function circuit. Thus, the whole circuit operates with a desired function.

6 Claims, 4 Drawing Figures

SEQUENTIAL LOGIC CIRCUIT

BACKGROUND OF THE INVENTION

This invention relates to a sequential logic circuit and, more particularly, to a multi-functional sequential logic circuit comprising semiconductor integrated circuits.

A block diagram of a typical sequential logic circuit is shown in FIG. 1. This circuit comprises of a preceding logic means 1, a logic memory means 2, and a succeeding logic means 3. A flip-flop circuit is usually utilized for the logic memory means 2, and a logic gate or a ROM is usually utilized for the preceding logic means 1 and the succeeding logic means 3. The preceding logic means 1 is supplied with two input signals, that is, an external INPUT 4 from an external circuit (not shown), and a logic state 5 from the logic memory means 2. With these two input signals, a logic calculation is executed so that the preceding logic means 1 generates a new logic state 6 and the content of the logic memory means 2 is rewritten with the generated new logic state. On the other hand, the logic state 5 is also given to the succeeding logic means 3. Then the succeeding logic means 3 outputs an OUTPUT 7 which is obtained from the logic state signal 5 through a predetermined logic calculation. Thus the sequential logic circuit decides the next logic state always depending on the present logic state and the external INPUT.

As each of the preceding logic means 1 and the succeeding logic means 3 is made up of a logic gate or a ROM, a logic calculation executed in each logic means is defined by an arrangement of the logic gate or the content of the ROM. In conclusion, the function of the whole sequential logic circuit is defined unequivocally by them. When a user wants to operate the sequential logic circuit with another function, a rearrangement of the logic gates or a change of the ROM is required. Even if the desired function slightly differs from the present function, the whole circuit need to be changed. The change requires considerable time and labor. In order to give a multi-function to the sequential logic circuit, the whole circuit becomes large and complex because an individual arrangement of logic circuits or an individual ROM have to be provided for each function.

SUMMARY OF THE INVENTION

The object of this invention is to provide a novel sequential logic circuit whose logic function can be easily altered.

The foregoing object is accomplished by providing a sequential logic circuit comprising a logic memory means which stores a predetermined logic state; a preceding logic means which is supplied with an external input and a logic state stored in the logic memory means as inputs for generating a new logic state by executing a logic calculation upon these inputs, and for rewriting the content of the logic memory means with said new logic state; a succeeding logic means which is supplied with said logic state stored in the logic memory means as an input for outputting a logic state obtained from a logic calculation with the input; and a function defining means which defines a logic calculation executed in the preceding logic means and/or the succeeding logic means depending on the desired function.

DETAILED DESCRIPTION OF THE PREFERRED EMBODIMENT

Figure 1:
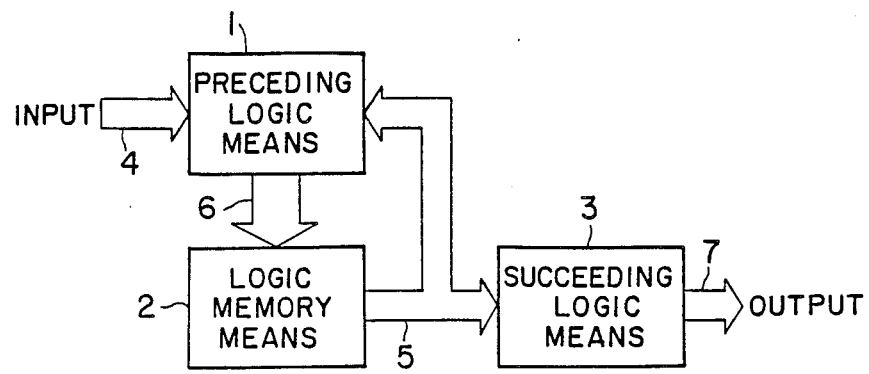
FIG. 1 illustrates a block diagram showing a sequential logic circuit according to the prior art.
Figure 2:
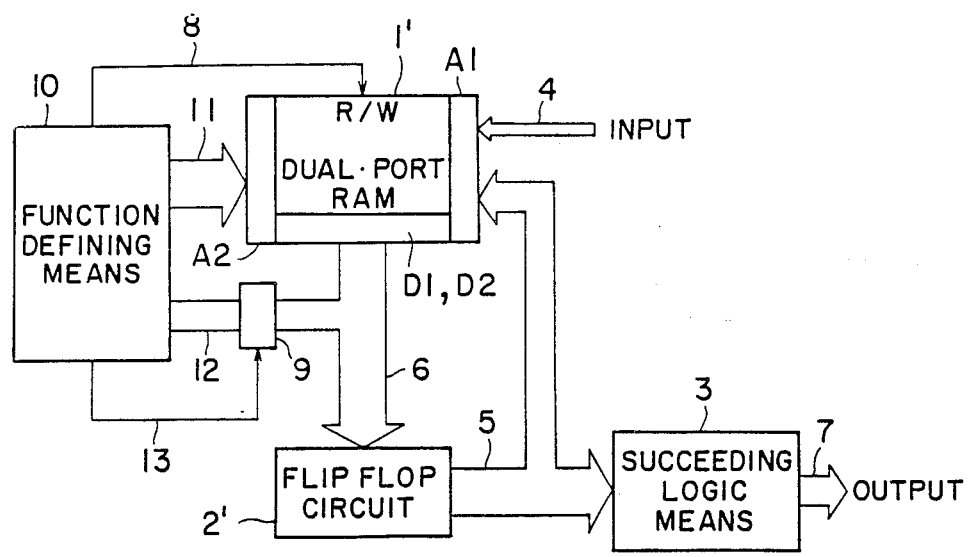
FIG. 2 illustrates a block diagram showing one embodiment of a sequential logic circuit according to this invention.

The sequential logic circuit shown in FIG. 2 illustrates an embodiment of the invention in which a logic calculation executed in a preceding logic means is definable. The preceding logic means comprises a dual-port RAM 1', and the logic memory means comprises a flip-flop circuit 2'. An external INPUT 4 and a logic state 5 outputted from the flip-flop circuit 2' are given to a first address port A1 of the RAM 1', and a corresponding data which is selected based on a given address through the port A1 is outputted as a new logic state 6 through a first data port D1. Ordinarily, the dual-port RAM 1' operates with the first ports A1 and D1. In this ordinary mode, as an R/W signal 8 indicates "read", an output data is read out through the data port D1. A selecting gate 9 is closed so that the data port D1 is connected only to the flip-flop circuit 2'. Therefore, in the above mode, this circuit operates similarly to the circuit shown in FIG. 1, and its function is decided depending on the contents of the RAM 1'.

When a user wants to operate this circuit to provide another function, the content of the RAM 1' is rewritten using the second port as follows. An address signal 11 from the function defining means 10 is given to the second address port A2, and a data signal 12 from the function defining means is given to the second data port D2 which is in common with port D1 in this embodiment. Simultaneously, the function defining means 10 gives an open gate signal 13 to the selecting gate 9 and an R/W signal 8 indicating "write" to the RAM 1', respectively, so as to rewrite the RAM 1' with the data signal 12. Thus, the content of the RAM 1' is rewritten with desired data, so that the circuit shown in FIG. 2 operates with a desired function after it has returned to the ordinary mode.

Figure 3:
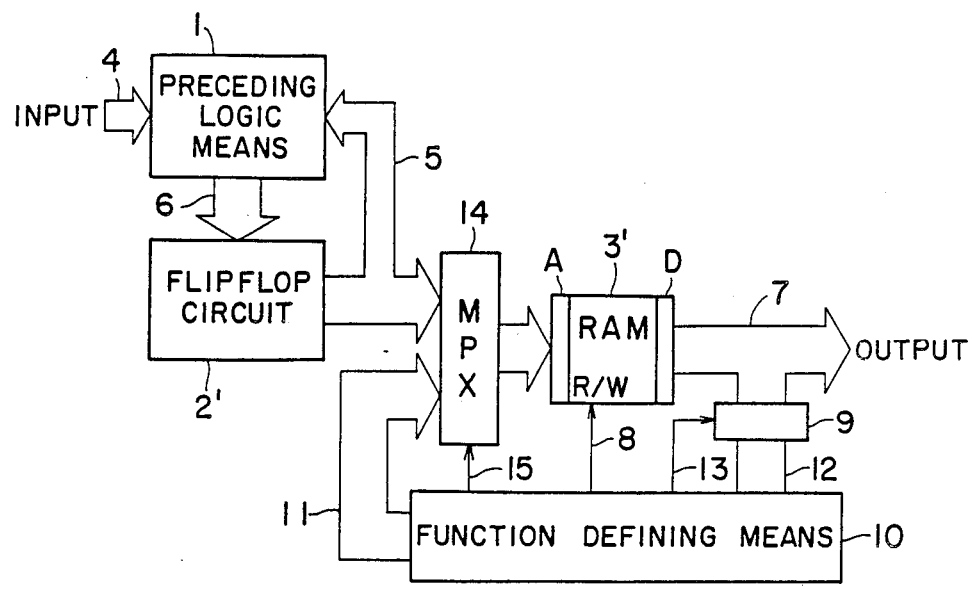
FIG. 3 illustrates a block diagram showing another embodiment of a sequential logic circuit according to this invention.

The sequential logic circuit shown in FIG. 3 illustrates another embodiment of the invention in which a logic calculation executed in a succeeding logic means is definable. The succeeding logic means comprises a RAM 3' and the logic memory means includes a flip-flop circuit 2'. Though the RAM 3' is a single-port RAM, it operates in the same manner as the dual-port RAM 1' shown in FIG. 2 because of the function of a multiplexer 14. The multiplexer 14 selects either a logic state 5 from the flip-flop circuit 2' or an address signal 11 from the function defining means 10 depending on a selecting signal 15 from the function defining means 10. The signal selected by the multiplexer 14 is given to an address port A of the RAM 3'. Ordinarily, as the multiplexer 14 selects the logic state 5 and as an R/W signal 8 indicates "read", an output data which corresponds to the logic state 5 is read out through a data port D as an OUTPUT signal. In this ordinary mode, a selecting gate 9 is closed and this sequential logic circuit operates similarly to the circuit shown in FIG. 1. The function of this circuit is decided depending on the content of the RAM 3'.

When a user wants to operate this circuit to provide another function, the content of the RAM 3' is rewritten as follows. The selecting signal 15 causes the multiplexer 14 to select the address signal 11 so as to access the RAM 3' with the signal 11. Simultaneously, the function defining means 10 gives an open gate signal 13 to the selecting gate 9 and an R/W signal 8 indicating "write" to the RAM 3', respectively, so as to give a data signal 12 to the data port D thereby effecting a write operation. Thus the content of the RAM 3' is rewritten with desired data, so that this circuit operates with a desired function after it has returned to the ordinary mode.

Figure 4:
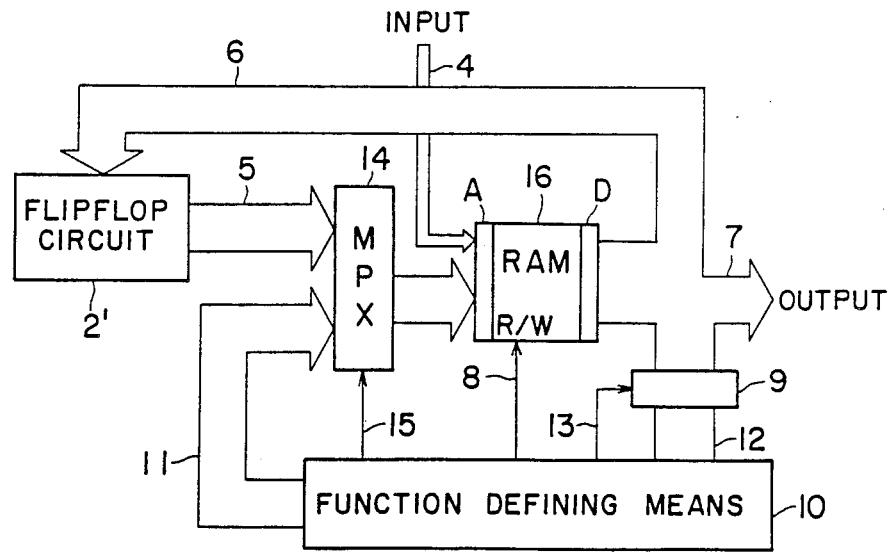
FIG. 4 illustrates a block diagram showing a further embodiment of a sequential logic circuit according to this invention.

The sequential logic circuit shown in FIG. 4 illustrates still further embodiment of the invention in which a logic calculations executed in both of the preceding and succeeding logic means are definable. Each of the preceding and succeeding logic means includes a RAM 16. As a consequence, a part of addresses of the RAM 16 is assigned to the preceding logic means and the other part to the succeeding logic means, respectively. The logic memory means is constituted by of a flip-flop circuit 2'. Though the RAM 16 is a single-port RAM, it operates in the same manner as a dual-port RAM because of a function of a multiplexer 14. The multiplexer 14 selects either a logic state 5 from the flip-flop circuit 2' or an address signal 11 from the function defining means 11 depending on a selecting signal 15 from the function defining means 10. The selected signal is given to an address port A of a RAM 16. Ordinarily, as the multiplexer 14 selects the logic state 5 and an R/W signal 8 indicates "read", an output data which corresponds to the logic state 5 is read out through a data port D. This output signal is given to an external circuit as an OUTPUT signal and also given to the flip-flop circuit 2' as a new logic state 6. In the above described ordinary mode, the selecting gate 9 is closed. Thus the logic circuit shown in FIG. 4 operates similarly to the logic circuit shown in FIG. 1, and its function is decided depending on the content of the RAM 16.

When a user wants to operate this circuit to provide another function, the content of the RAM 16 is rewritten as follows. The selecting signal 15 causes the multiplexer 14 to select the address signal 11 so as to access the RAM 16 with the signal 11. Simultaneously, the function defining means 10 gives an open gate signal 13 to the selecting gate 9 and an R/W signal 8 indicating "write" to the RAM 16, respectively, so as to give a data signal 12 to the data port D, thus effecting a write operation. Thus, the content of the RAM 16 is rewritten with desired data, so that this circuit operates with a desired function after it has returned to the ordinary mode.

What is claimed is:

1. A sequential logic circuit, comprising a logic memory means which stores a predetermined logic state; a preceding logic means which is supplied with an external input and a logic state stored in said logic memory means as inputs, for generating a new logic state by executing a logic calculation upon these inputs, and for rewriting the content of said logic memory means with said new logic state; a succeeding logic means which is supplied with said logic state stored in said logic memory means as an input for outputting a logic state obtained from a logic calculation with the input; and a function defining means which defines a logic calculation executed in said preceding logic means and/or said succeeding logic means depending on the desired function.

2. A sequential logic circuit according to claim 1, wherein the logic memory means comprises a flip-flop circuit.

3. A sequential logic circuit according to claim 1, wherein the preceding logic means comprises a RAM which outputs a data stored at a selected address as a new logic state.

4. A sequential logic circuit according to claim 3, wherein the RAM is a dual-port RAM having a first address port, a first data port, a second address port, and a second data port, the external input and the logic state stored in the logic memory means are given to the first address port of said RAM, the first data port of said RAM is connected to said logic memory means, the second address port and the second data port of said RAM are connected to the function defining means, and said first address and data ports are used for reading data, said second address and data ports are used for writing data.

5. A sequential logic circuit according to claim 1, wherein the succeeding logic means comprises a RAM which outputs a data stored at a selected address as an output signal.

6. A sequential logic circuit according to claim 5, wherein the RAM is a dual-port RAM having a first address port, a first data port, a second address port, and a second data port, the logic state stored in the logic memory means is given to the first address port, an output signal to be supplied to an external circuit is taken out from the first data port, the second address port and the second data port are connected to the function defining means, said first address and data ports are used for reading data, and said second address and data ports are used for writing data.

* * * * *